(12) United States Patent
Kawasumi

(10) Patent No.: US 12,057,186 B2
(45) Date of Patent: Aug. 6, 2024

(54) SEMICONDUCTOR INTEGRATED CIRCUIT AND INFORMATION PROCESSING APPARATUS

(71) Applicant: Kioxia Corporation, Tokyo (JP)

(72) Inventor: Atsushi Kawasumi, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 291 days.

(21) Appl. No.: 17/471,909

(22) Filed: Sep. 10, 2021

(65) Prior Publication Data
US 2022/0301597 A1 Sep. 22, 2022

(30) Foreign Application Priority Data
Mar. 19, 2021 (JP) ................. 2021-046227

(51) Int. Cl.
| | |
|---|---|
| *G11C 5/06* | (2006.01) |
| *G06F 7/544* | (2006.01) |
| *G11C 11/412* | (2006.01) |
| *G11C 11/417* | (2006.01) |

(52) U.S. Cl.
CPC ............ *G11C 5/063* (2013.01); *G06F 7/5443* (2013.01); *G11C 11/412* (2013.01); *G11C 11/417* (2013.01); *G06F 2207/4824* (2013.01)

(58) Field of Classification Search
CPC ..... G11C 5/063; G11C 11/412; G11C 11/417; G06F 7/5443; G06F 7/1006; G06F 2207/4824; G06N 3/00; G06N 3/02; G06N 3/04; G06N 3/0454; G06N 3/06; G06N 3/063; G06N 3/0635
See application file for complete search history.

(56) References Cited

U.S. PATENT DOCUMENTS

| | | | |
|---|---|---|---|
| 2006/0143428 A1 | 6/2006 | Noda et al. | |
| 2010/0172190 A1* | 7/2010 | Lavi ......................... | G11C 7/02 365/207 |
| 2019/0205095 A1 | 7/2019 | Gupta et al. | |
| 2020/0202204 A1 | 6/2020 | Kouno et al. | |
| 2023/0144740 A1* | 5/2023 | Tsukamoto ........... | G11C 11/412 708/190 |

FOREIGN PATENT DOCUMENTS

| | | |
|---|---|---|
| JP | 2006-164183 A | 6/2006 |
| WO | WO-2019/049741 A1 | 3/2019 |

* cited by examiner

*Primary Examiner* — Seokjin Kim
(74) *Attorney, Agent, or Firm* — Foley & Lardner LLP

(57) ABSTRACT

A semiconductor integrated circuit has a plurality of memory cells arranged in a first direction and each storing first data, a plurality of first wirings provided to correspond to the plurality of memory cells arranged in the first direction and supplying second data to be multiplied by the first data, and a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is a first logic; and another second wiring which is discharged when the multiplication data is a second logic.

19 Claims, 16 Drawing Sheets

|  |  | FIRST DATA (WEIGHTING FACTOR) | |
|---|---|---|---|
|  |  | 0 | 1 |
| SECOND DATA | 0 | BL<-> ↓ | BL<-> ↓ |
|  | 1 | BL<-> ↓ | BL<+> ↓ |

FIG. 3

|  |  | FIRST DATA (WEIGHTING FACTOR) | |
| --- | --- | --- | --- |
|  |  | 0 | 1 |
| SECOND DATA | 0 | → | → |
|  | 1 | → | ↓ |

4: SELECTION CIRCUIT

SEMICONDUCTOR INTEGRATED CIRCUIT AND INFORMATION PROCESSING APPARATUS

CROSS REFERENCE TO RELATED APPLICATIONS

This application is based upon and claims the benefit of priority from the prior Japanese Patent Application No. 2021-046227, filed on Mar. 19, 2021, the entire contents of which are incorporated herein by reference.

FIELD

Embodiments of the present invention relate to a semiconductor integrated circuit and an information processing apparatus.

BACKGROUND

Recently, information processing using machine learning has been performed in various fields. In machine learning, for example, a learning process of updating a weighting factor used in a convolutional neural network (CNN) is performed, but it is necessary to repeat a large number of product-sum operation processing in order to update the weighting factor. If the product-sum operation processing can be performed by hardware instead of software, machine learning can be performed quickly and efficiently.

Since a result of the product-sum operation is multi-value data of two or more values, a wiring that outputs the result of the product-sum operation may have three or more potential levels. Therefore, it is necessary to correctly identify a product-sum operation value from the potential level of the wiring that outputs the result of the product-sum operation.

However, reduction in voltage has progressed regarding a power supply voltage of a semiconductor integrated circuit including a semiconductor memory, and it is not easy to correctly identify the product-sum operation value from the potential level of the wiring.

BRIEF DESCRIPTION OF THE DRAWINGS

FIG. 3 is a diagram illustrating a correspondence relationship between a multiplication result of first data and second data and discharge of the bit line pair;

DETAILED DESCRIPTION

According to one embodiment, a semiconductor integrated circuit has a plurality of memory cells arranged in a first direction and each storing first data, a plurality of first wirings provided to correspond to the plurality of memory cells arranged in the first direction and supplying second data to be multiplied by the first data, and a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is a first logic; and another second wiring which is discharged when the multiplication data is a second logic.

Hereinafter, embodiments of a semiconductor integrated circuit and an information processing apparatus will be described with reference to the drawings. Although main components of the semiconductor integrated circuit and the information processing apparatus will be mainly described hereinafter, the semiconductor integrated circuit and the information processing apparatus may have components and functions that are not illustrated or described. The following description does not exclude the components and functions that are not illustrated or described.

First Embodiment

Figure 1:
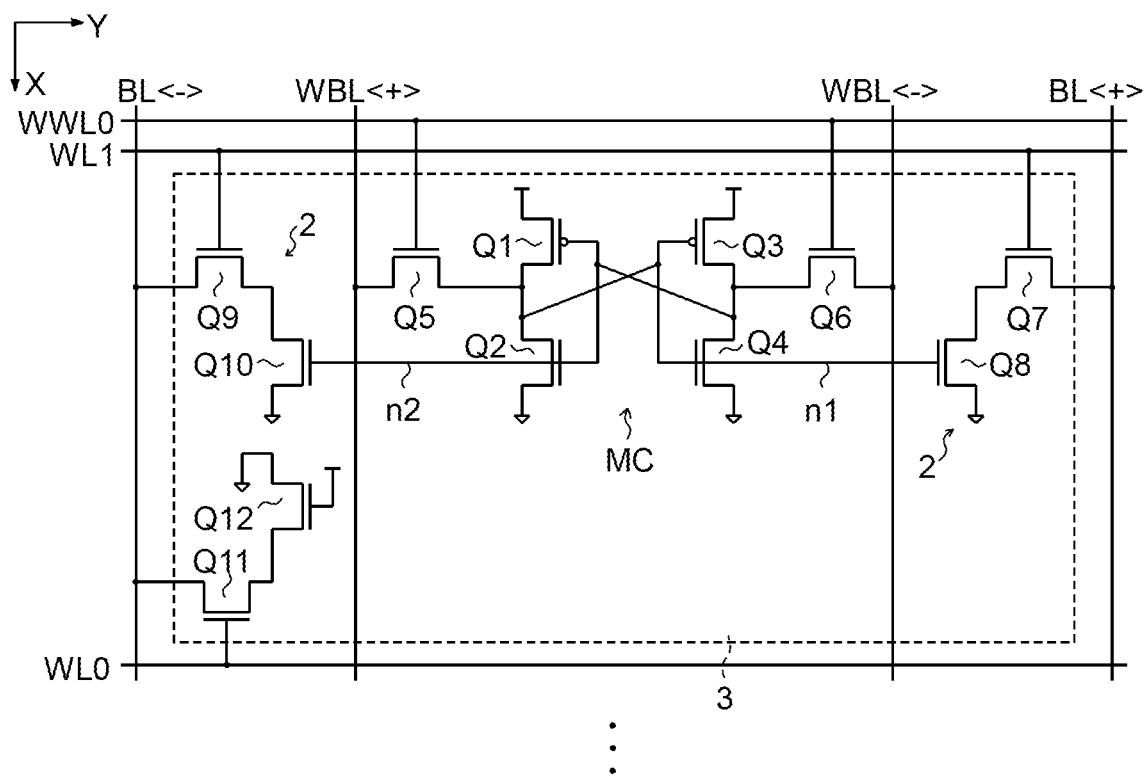
FIG. 1 is a circuit diagram of a semiconductor integrated circuit according to a first embodiment.

FIG. 1 is a circuit diagram of a semiconductor integrated circuit according to a first embodiment. A semiconductor integrated circuit 1 of FIG. 1 can be configured using a semiconductor memory (also referred to as a semiconductor storage device). The semiconductor memory constituting the semiconductor integrated circuit 1 of FIG. 1 may be a volatile memory, such as a static random access memory (SRAM) and a dynamic random access memory (DRAM), or may be a nonvolatile memory such as a NAND flash memory.

The semiconductor integrated circuit 1 of FIG. 1 includes a plurality of memory cells MC, a plurality of word lines WL0 and WL1, and a bit line pair BL<+> and BL<−>. In the present specification, the word lines WL0 and WL1 will be sometimes referred to as a first wiring, and the bit line pair BL<+> and BL<−> will be sometimes referred to as a second wiring pair.

The plurality of word lines WL0 and WL1 are provided to correspond to the plurality of memory cells MC arranged in a first direction X, and supply second data to be multiplied by first data. Although one memory cell MC is illustrated in FIG. 1, the plurality of memory cells MC are arranged in the first direction X. In addition, the plurality of memory cells MC may also be arranged in a second direction Y.

The bit line pair BL<+> and BL<−> are provided to correspond to the plurality of memory cells MC arranged in the first direction X and extend in the first direction X. The bit line pair BL<+> and BL<−> include one bit line BL<+>, which is discharged when multiplication data of the first data stored in each of the plurality of memory cells MC and the second data supplied in a corresponding word line, is a first logic, and the other bit line BL<−> which is discharged when the multiplication data is a second logic. Here, the discharge refers to lowering a potential of the bit line. The potential of the bit line is lowered each time the discharge is performed.

The word lines WL0 and WL1 extend in the second direction Y. When two or more memory cells MC are arranged in the second direction Y, the two or more memory cells MC are connected to the same word lines WL0 and WL1. The two word lines WL0 and WL1 are provided for each of the memory cells MC, and any one of the two word lines WL0 and WL1 is selected. In the present specification, a logic of the selected word line is set to 1, and a logic of the unselected word line is set to 0. The logics of these two word lines WL0 and WL1 is the second data. For example, the word line WL0 is selected when the second data is 0, and the word line WL1 is selected when the second data is 1.

Although not illustrated in FIG. 1, the plurality of memory cells MC arranged in the first direction X and the second direction Y are referred to as a memory cell array. The word lines WL0 and WL1 are provided for each of memory cell groups of each of rows arranged along the second direction Y in the memory cell array. The bit line pair BL<+> and BL<−> is provided for each of memory cell groups of each of columns arranged along the first direction X in the memory cell array.

The memory cell MC of FIG. 1 is connected to a write bit line pair WBL<+> and WBL<−>. The write bit line pair WBL<+> and WBL<−> is also arranged in the first direction X similarly to the bit line pair BL<+> and BL<−>. The memory cell MC of FIG. 1 illustrates an example of an SRAM cell. The memory cell MC of FIG. 1 includes six transistors Q1 to Q6. The transistors Q1 and Q3 are PMOS transistors, and the transistors Q2 and Q4 to Q6 are NMOS transistors. The transistors Q1 and Q2 are cascode-connected between a power supply voltage node and a ground node. Similarly, the transistors Q3 and Q4 are cascode-connected between the power supply voltage node and the ground node. Both gates of the transistors Q1 and Q2 are connected to both drains of the transistors Q3 and Q4 and a source of the transistor Q6. Similarly, both gates of the transistors Q3 and Q4 are connected to both drains of the transistors Q1 and Q2 and a source of the transistor Q5.

Figure 2:
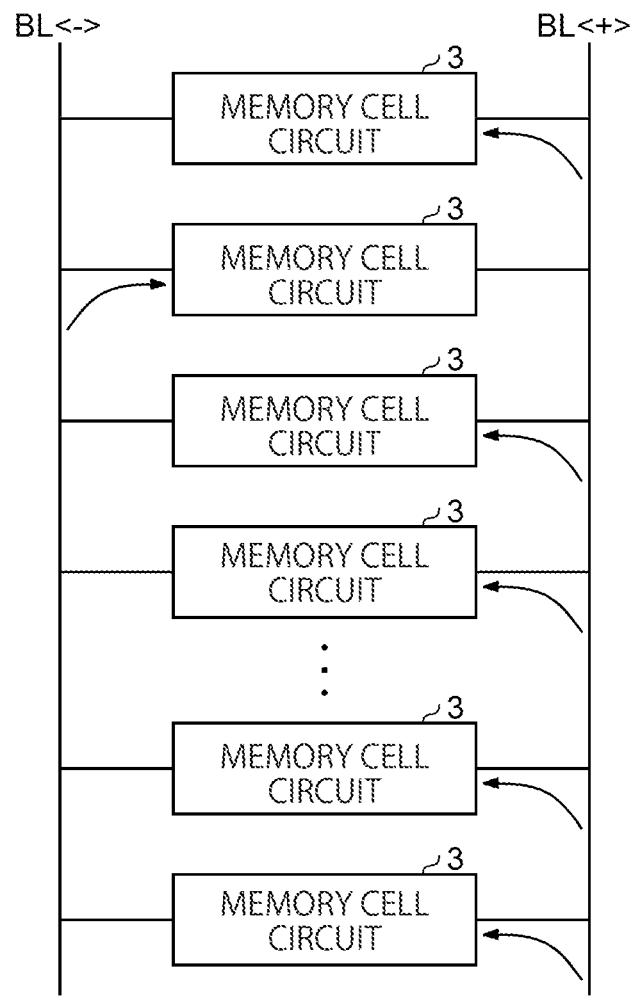
FIG. 2 is a diagram schematically illustrating a discharge current flowing through a bit line pair in the semiconductor integrated circuit of FIG. 1.

Both gates of the transistors Q5 and Q6 are connected to a write word line WWLi (WWL0 in the example of FIG. 2). Both drains of the transistors Q5 and Q6 are connected to the write bit line pair WBL<+> and WBL<−>.

The semiconductor integrated circuit 1 of FIG. 1 includes an arithmetic control circuit 2. The arithmetic control circuit 2 is connected between the bit line pair BL<+> and BL<−> and output nodes n1 and n2 of the corresponding memory cell MC. The arithmetic control circuit 2 multiplies the first data output from the corresponding memory cell MC and the second data supplied from the corresponding word line, and discharges the one bit line BL<+> or the other bit line BL<−> based on a multiplication result. The discharge of the one bit line BL<+> or the other bit line BL<−> is equivalent to performing a sum operation of multiplication results, that is, a product-sum operation. In the present specification, the memory cell MC and the corresponding arithmetic control circuit 2 are collectively referred to as a memory cell circuit 3.

The arithmetic control circuit 2 includes transistors Q7 to Q12. The transistors Q7 to Q12 are NMOS transistors. The transistors Q7 and Q8 are cascode-connected between the one bit line BL<+> and the ground node. A gate of the transistor Q7 is connected to the word line WL1. A gate of the transistor Q8 is connected to the gates of the transistors Q3 and Q4 and both the drains of the transistors Q1 and Q2.

The transistors Q9 and Q10 are cascode-connected between the other bit line BL<−> and the ground node. A gate of the transistor Q9 is connected to the word line WL1. A gate of the transistor Q10 is connected to the gates of the transistors Q1 and Q2 and both the drains of the transistors Q3 and Q4.

The transistors Q11 and Q12 are cascode-connected between the other bit line BL<−> and the ground node. A gate of the transistor Q11 is connected to the word line WL0. A gate of the transistor Q12 is connected to the power supply voltage node and is always turned on. Thus, when the word line WL0 is selected (in the case of the logic 0), the other bit line BL<−> is discharged by the transistors Q11 and Q12.

FIG. 2 is a diagram schematically illustrating a discharge current flowing through the bit line pair BL<+> and BL<−> in the semiconductor integrated circuit 1 of FIG. 1. As illustrated in FIG. 2, a plurality of the memory cell circuits 3 are connected to the bit line pair BL<+> and BL<−>. Each of the memory cell circuits 3 includes the memory cell MC and the corresponding arithmetic control circuit 2. An arrow line in FIG. 2 indicates a direction of the discharge current flowing through the bit line pair BL<+> and BL<−>. When the discharge current flows from the one bit line BL<+> or the other bit line BL<−> to each of the memory cell circuits 3, the one bit line BL<+> or the other bit line BL<−> is discharged. As illustrated in FIG. 2, any one of the bit line BL<+> and the other bit line BL<−> is exclusively discharged in the semiconductor integrated circuit 1 of FIG. 1.

In the semiconductor integrated circuit 1 of FIG. 1, any bit line of the bit line pair BL<+> and BL<−> is exclusively discharged every time any one of the word lines WL0 and WL1 is selected (becomes the logic 1). That is, the other bit line BL<−> is not discharged when the one bit line BL<+> is discharged, and the one bit line BL<+> is not discharged when the other bit line BL<−> is discharged.

The semiconductor integrated circuit 1 of FIG. 1 can be used to perform a product-sum operation. The memory cell MC can store a weighting factor for the product-sum operation as the first data. The logics of the word lines WL0 and WL1 corresponds to the second data to be multiplied by the weighting factor in the product-sum operation. In this manner, the first data representing the weighting factor and the second data supplied from the word line can be multiplied using one memory cell MC. In the plurality of memory cell circuits 3 connected to the bit line pair BL<+> and BL<−>, a multiplication of the first data representing the weighting factor and the second data supplied from the word line can be performed a plurality of times, and a result of the product-sum operation, which is a sum of these multiplications can be represented by a discharge amount of the bit line pair BL<+> and BL<−>. Thus, the result of the product-sum operation can be output from the bit line pair BL<+> and BL<−>.

FIG. 3 is a diagram illustrating a correspondence relationship between the multiplication result of first data indicating the weighting factor in the memory cell MC of FIG. 1 and the second data indicating the logic of the word line and the discharge of the bit line pair BL<+> and BL<−>. As illustrated in FIG. 3, both the first data and the second data can take binary data (0 and 1). Only when both the first data and the second data are 1, the one bit line BL<+> is discharged. At this time, both the transistors Q7 and Q8 are turned on, and the one bit line BL<+> is discharged to the ground node through the transistors Q7 and Q8, and a potential is lowered. Since the transistor Q10 is turned off, the other bit line BL<−> is not discharged. When at least one of the first data and the second data is 0, the one bit line BL<+> is not discharged. The second data becomes 1 when the word line WL1 is selected, and the second data becomes 0 when the word line WL0 is selected.

When the first data and the second data are (0, 1), both the transistors Q9 and Q10 are turned on, and the other bit line BL<−> is discharged to the ground node through the transistors Q9 and Q10, and a potential decreases. The one bit line BL<+> is not discharged since the transistor Q8 is turned off.

When the first data and the second data are (0, 0) or (1, 0), the transistor Q11 is turned on. Since the transistor Q12 is always turned on, the other bit line BL<−> is discharged to the ground node through the transistors Q11 and Q12 when the transistor Q11 is turned on. In this manner, the word line WL0 is not used for the multiplication with the memory cell MC, and the other bit line BL<−> is discharged unconditionally when the word line WL0 is selected.

Figure 4A:
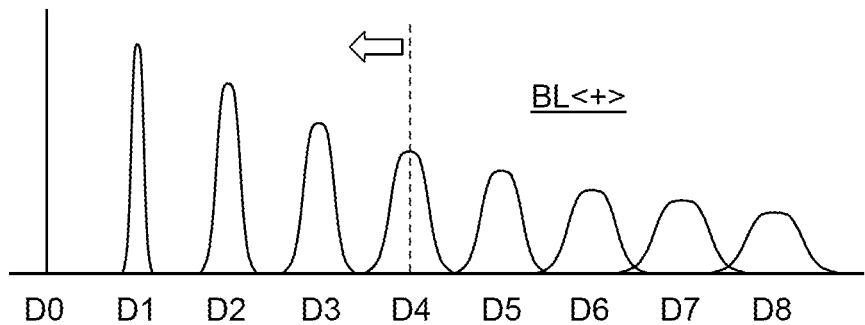
FIG. 4A is a diagram illustrating a potential and a discharge current of one bit line.
Figure 4B:
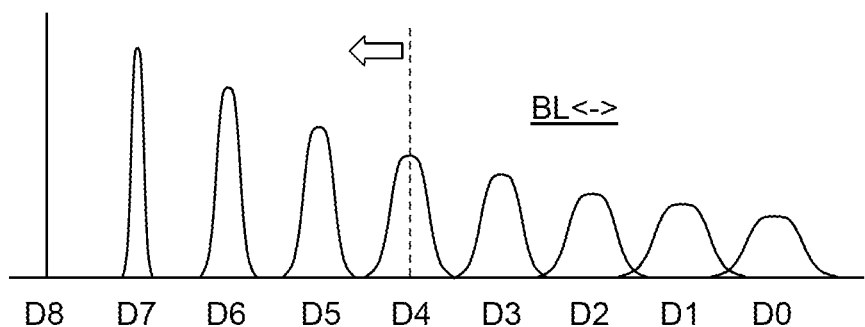
FIG. 4B is a diagram illustrating a potential and a discharge current of the other bit line.

FIG. 4A is a diagram illustrating a potential and a discharge current of the one bit line BL<+>, and FIG. 4B is a diagram illustrating a potential and a discharge current of the other bit line BL<−>. In FIGS. 4A and 4B, a horizontal axis represents the bit line potential, and a vertical axis represents the discharge current. Since the bit line potential decreases every time the discharge is performed, the horizontal axis in FIGS. 4A and 4B exactly represents an absolute value of the bit line potential.

FIGS. 4A and 4B illustrate a plurality of distribution waveforms. These distribution waveforms illustrate that a variation range of the bit line potential changes and the discharge current also changes whenever discharging the bit line pair BL<+> and BL<−>. An interval between adjacent distribution waveforms depends on a voltage level of a drain-to-source voltage Vds of the transistors Q7 and Q8 and a voltage level of a drain-to-source voltage Vds of the transistors Q9 and Q10 in FIG. 1.

As can be seen from the plurality of distribution waveforms, the discharge current flowing through the bit line pair BL<+> and BL<−> increases and the variation range of the bit line potential decreases as the number of times of discharge of the bit line pair BL<+> and BL<−> decreases. Until the number of times of discharge is about four, the interval between the distribution waveforms is separated, and the number of times of discharge can be accurately identified by detecting the potentials of the bit line pair BL<+> and BL<−>.

When the number of times of discharge is five or more, the voltage level of the voltage Vds decreases, and adjacent distribution waveforms overlap each other. When the distribution waveforms overlap each other, it is difficult to accurately identify the number of times of discharge with the potentials of the bit line pair BL<+> and BL<−>, and there is a possibility that a value of the product-sum operation is erroneously determined.

As illustrated in FIGS. 4A and 4B, when discharge occurs in any bit line of the bit line pair BL<+> and BL<−>, the discharge current when the discharge is performed for the first time is maximum, and the variation range of the bit line potential is minimum. When the bit line pair BL<+> and BL<−> has never been discharged, the discharge currents of the one bit line BL<+> and the other bit line BL<−> are zero. In FIGS. 4A and 4B, a case where the discharge current of the one bit line BL<+> is zero is denoted by D0, and a case where the discharge current of the other bit line BL<−> is zero is denoted by D8. In FIG. 4A, a D number incremented by one from D0 is allocated every time the number of times of discharge of the one bit line BL<+> increases. On the other hand, in FIG. 4B, a D number decremented by one from D8 is allocated every time the number of times of discharge of the other bit line BL<−> increases.

As illustrated in FIGS. 4A and 4B, the discharge current decreases and the variation range of the bit line potential increases as the number of times of discharge increases. When the number of times of discharge exceeds five, the variation ranges of adjacent bit line potentials overlap each other, and thus, it is difficult to identify the number of times of discharge with the potential of the bit line.

In FIGS. 4A and 4B, the other bit line BL<−> is D1 when the one bit line BL<+> is D1. When comparing the discharge current of D1 between the one bit line BL<+> and the other bit line BL<−>m the discharge current of the one bit line BL<+> is much larger as can be seen from FIGS. 4A and 4B. Thus, data of the bit line pair BL<+> and BL<−> is identified based on the potential of the one bit line BL<+>. When the one bit line BL<+> is D7, the other bit line BL<−> is D7. When comparing the discharge current of D7 between the one bit line BL<+> and the other bit line BL<−>m the discharge current of the other bit line BL<−> is much larger as can be seen from FIGS. 4A and 4B. Thus, data of the bit line pair BL<+> and BL<−> is identified based on the potential of the other bit line BL<−>.

When a discharge current flows through a bit line, a potential of the bit line decreases. Thus, it is desirable to compare the potential of the one bit line BL<+> with the potential of the other bit line BL<−> to identify the number of times of discharge based on the bit line having the higher potential. The selection of the bit line having the higher potential means to identify the number of times of discharge based on bit line potentials corresponding to four distribution waveforms on the left side of a broken line in FIG. 4A and bit line potentials corresponding to four distribution waveforms on the left side of the broken line in FIG. 4B. In addition, a discharge current in a case where the one bit line BL<+> is D4 and a discharge current in a case where the other bit line BL<−> is D4 are substantially the same, and data of the bit line pair BL<+> and BL<−> may be determined based on any discharge current. If the bit line having the higher potential is selected between the potential of the one bit line BL<+> and the potential of the other bit line BL<->, there is no hesitation in determining any bit line to be selected.

In this manner, the data of the bit line pair BL<+> and BL<-> is identified based on the discharge currents on the left side of the broken lines in FIGS. 4A and 4B in the present embodiment. More specifically, the data of the bit line pair BL<+> and BL<-> is identified based on a voltage of the one bit line BL<+> in the case of D1 to D3, the data of the bit line pair BL<+> and BL<-> is identified based on a voltage of any bit line in the case of D0, D4, and D8, and the data of the bit line pair BL<+> and BL<-> is identified based on a voltage of the other bit line BL<-> in the case of D5 to D7.

Figure 5:
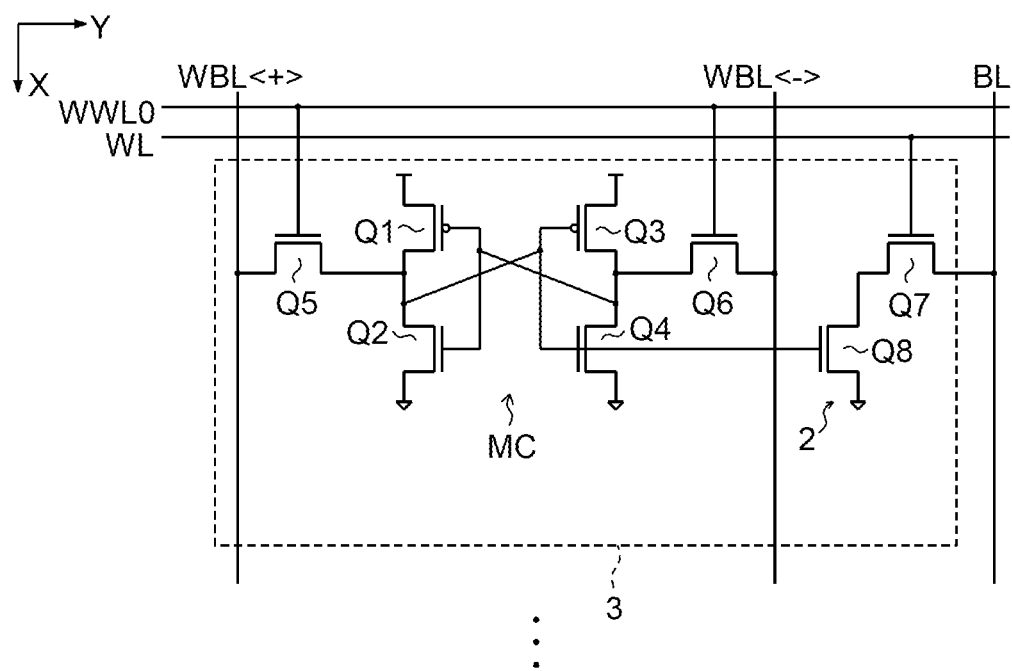
FIG. 5 is a circuit diagram of a semiconductor integrated circuit according to a comparative example.

FIG. 5 is a circuit diagram of a semiconductor integrated circuit 100 according to a comparative example. The semiconductor integrated circuit 100 of FIG. 5 includes a plurality of memory cells MC, one word line WL, one bit line BL, and an arithmetic control circuit 2. In FIG. 5, circuit elements common to those in FIG. 1 are denoted by the same reference signs, and differences will be mainly described hereinafter.

The memory cell MC of FIG. 5 has an internal configuration similar to that of the memory cell MC of FIG. 1. While the semiconductor integrated circuit 1 of FIG. 1 includes the bit line pair BL<+> and BL<-> formed of two bit lines, the semiconductor integrated circuit 100 of FIG. 5 includes the single bit line BL. Transistors Q7 and Q8 are cascode-connected between the bit line BL and a ground node. A gate of the transistor Q7 is connected to the word line WL, and a gate of the transistor Q8 is connected to both gates of transistors Q3 and Q4 and both drains of transistors Q1 and Q2 in the memory cell MC. The semiconductor integrated circuit 100 of FIG. 5 includes only the single bit line BL, and thus, does not include the transistors Q9 to Q12 in the semiconductor integrated circuit 1 of FIG. 1.

In addition, the semiconductor integrated circuit 100 of FIG. 5 includes only the single word line WL and does not include the word line WL0 of FIG. 1, and thus, does not include the transistors Q11 and Q12 in the semiconductor integrated circuit 1 of FIG. 1.

In this manner, a plurality of memory cells MC arranged in a first direction X are connected to the single bit line BL extending in the first direction X in the semiconductor integrated circuit 100 of FIG. 5. In addition, the single word line WL is connected to one or a plurality of memory cells MC arranged in a second direction Y.

Figure 6:
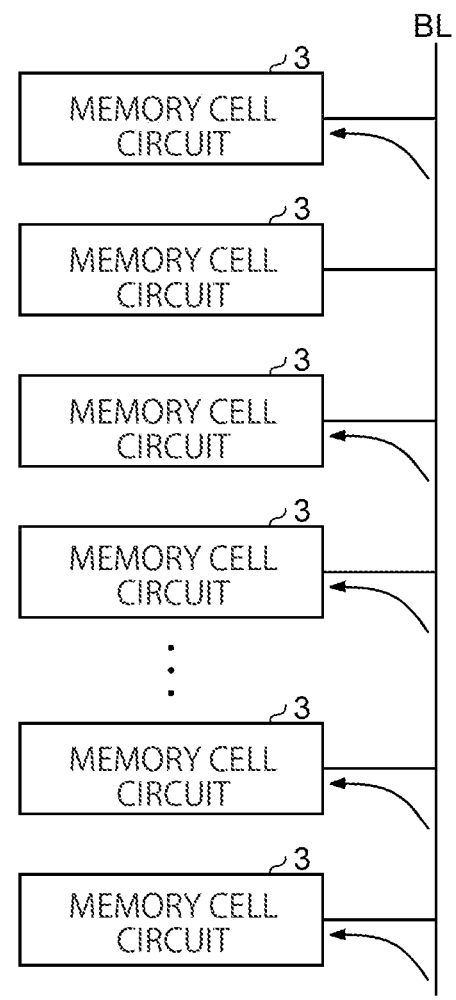
FIG. 6 is a diagram schematically illustrating a discharge current flowing through a bit line in the semiconductor integrated circuit of FIG. 5.

FIG. 6 is a diagram schematically illustrating a discharge current flowing through the bit line in the semiconductor integrated circuit 100 of FIG. 5. As illustrated in FIG. 6, only the single bit line BL is connected to the plurality of memory cell circuits 3 of one column arranged in the first direction X in the semiconductor integrated circuit 100 of FIG. 5, and thus, the discharge current flows from the bit line BL to a corresponding memory cell circuit 3 only for the memory cell circuit 3 whose multiplication result is 1.

Figures 7, 8:
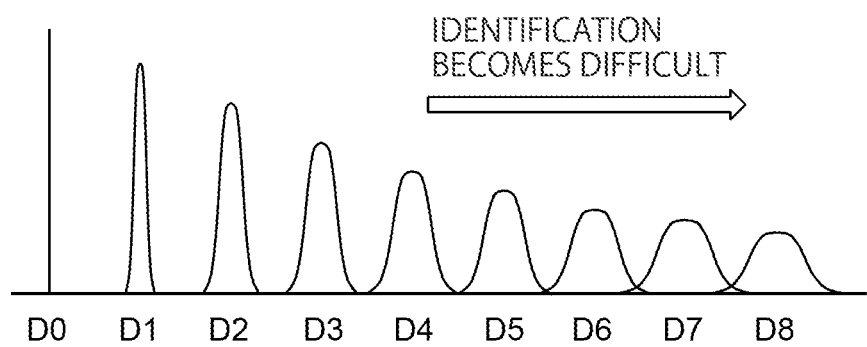
FIG. 7 is a diagram illustrating a correspondence relationship between a multiplication result of first data and second data in FIG. 5 and discharge of a bit line BL.
FIG. 8 is a diagram illustrating a potential and a discharge current of the bit line of FIG. 5.

FIG. 7 is a diagram illustrating a correspondence relationship between a multiplication result of first data indicating a weighting factor in the memory cell MC of FIG. 5 and second data indicating a logic of the word line WL and discharge of the bit line BL. As illustrated in FIG. 7, the bit line BL is discharged only when the first data and the second data are (1, 1). When the first data and the second data are (0, 0), (0, 1), or (1, 0), a voltage of the bit line BL does not change.

FIG. 8 is a diagram illustrating a potential and a discharge current of the bit line of FIG. 5. In FIG. 8, the discharge current decreases and a variation amount of a bit line potential increases as the number of times of discharge of the bit line increases, which is similar to FIG. 4A. When the number of times of discharge exceeds four, bit line potentials in the adjacent numbers of times of discharge overlap each other, and thus, it is difficult to accurately identify the number of times of discharge even if the bit line potential is detected.

On the other hand, the one bit line BL<+> and the other bit line BL<-> are provided to identify the data of the bit line pair BL<+> and BL<-> based on the potential of the bit line through which a larger discharge current flows in the semiconductor integrated circuit 1 of FIG. 1. Thus, it is unnecessary to determine the data of the bit line pair BL<+> and BL<-> based on the potential of the bit line having a large potential variation range as illustrated in FIG. 8, and the reliability of read data can be improved.

Figure 9:
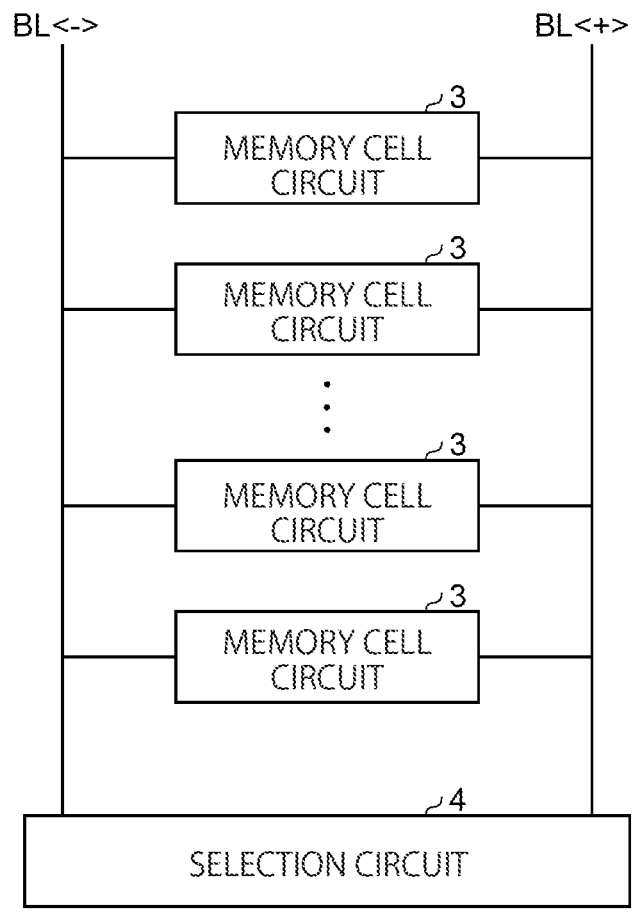
FIG. 9 is a diagram illustrating a semiconductor integrated circuit in which a selection circuit is added to FIG. 1.

FIG. 9 is a diagram illustrating the semiconductor integrated circuit 1 in which a selection circuit 4 is added to FIG. 1. The selection circuit 4 of FIG. 9 selects a bit line having a higher potential between the one bit line BL<+> and the other bit line BL<->. In addition, the selection circuit 4 identifies the data of the bit line pair BL<+> and BL<-> based on a potential of a selected second wiring.

Figure 10:
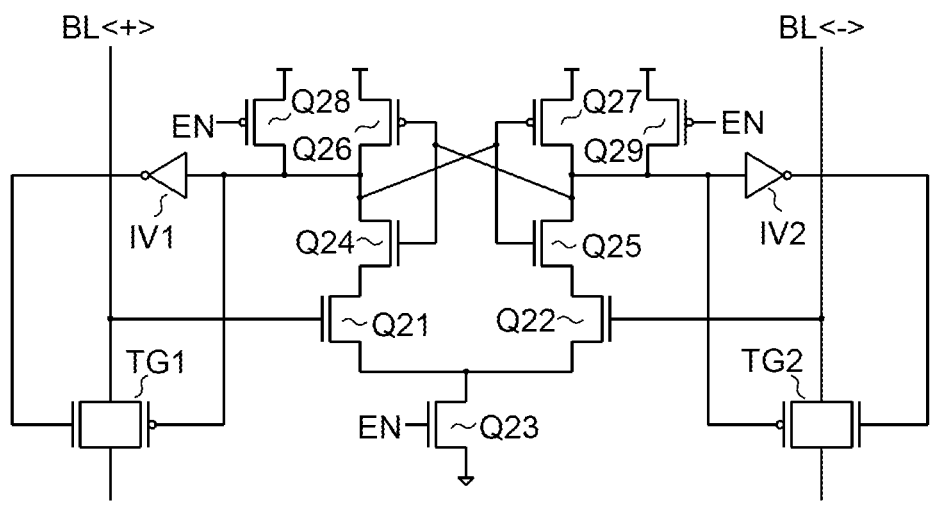
FIG. 10 is a circuit diagram illustrating an example of an internal configuration of the selection circuit.

FIG. 10 is a circuit diagram illustrating an example of an internal configuration of the selection circuit 4. The selection circuit 4 of FIG. 10 has a symmetrical circuit configuration, receives the input of the bit line pair BL<+> and BL<-> of FIG. 1, compares the potentials of the one bit line BL<+> and the other bit line BL<-> constituting the bit line pair BL<+> and BL<-> to select and output the bit line having the higher potential.

The selection circuit 4 of FIG. 10 includes a differential transistor pair Q21 and Q22, a transistor Q23 forming a current source, transistors Q24 to Q27 forming a data holding circuit, transistors Q28 and Q29 pulling up an output line of the data holding circuit, inverters IV1 and IV2, and transfer gates TG1 and TG2. The transistors Q21 to Q25 are NMOS transistors, and the transistors Q26 to Q29 are PMOS transistors.

The one bit line BL<+> is connected to a gate of the transistor Q21, and the other bit line BL<-> is connected to a gate of the transistor Q22. A drain of the transistor Q23 is connected to sources of the transistors Q21 and Q22, and a source of the transistor Q23 is connected to the ground node. A source of the transistor Q24 is connected to a drain of the transistor Q21, and a source of the transistor Q25 is connected to a drain of the transistor Q22.

A drain of the transistor Q24 and gates of the transistors Q26 and Q25 are connected to a drain of the transistor Q27. A source of the transistor Q26 is connected to the power supply voltage node. A drain of the transistor Q25 and gates of the transistors Q27 and Q24 are connected to a drain of the transistor Q26. A source of the transistor Q27 is connected to the power supply voltage node.

A drain of the transistor Q24 is connected to a drain of the transistor Q28 and an input node of the inverter IV1. A source of the transistor Q28 is connected to the power supply voltage node. A drain of the transistor Q25 is connected to a drain of the transistor Q29 and an input node of the inverter IV2. A source of the transistor Q29 is connected to the power supply voltage node.

Input and output nodes of the inverter IV1 is connected to a complementary control terminal of the transfer gate TG1. The transfer gate TG1 switches whether to output the potential of the one bit line BL<+> according to a signal logic of the complementary control terminal. Input and output nodes of the inverter IV2 is connected to a complementary control terminal of the transfer gate TG2. The transfer gate TG2 switches whether to output the potential of the other bit line BL<−> according to a signal logic of the complementary control terminal.

The selection circuit 4 of FIG. 10 compares the potentials of the bit line pair BL<+> and BL<−> by the differential transistor pair Q21 and Q22, and increases a potential of a bit line having a higher potential. As a result, the output of any one of the inverters IV1 and IV2 is set to a high level. When the output of the inverter IV1 or IV2 becomes high, a corresponding transfer gate is open, and the potential of the corresponding bit line passes through the transfer gate and is output.

For example, when the potential of the one bit line BL<+> is higher than the potential of the other bit line BL<−>, a drain voltage of the transistor Q24 becomes lower than a drain voltage of the transistor Q25, the output of the inverter IV1 is set to a high level, and the output of the inverter IV2 is set to a low level. Thus, the transfer gate TG1 controlled by the output of the inverter IV1 is open, the one bit line BL<+> is selected, and the potential of the one bit line BL<+> is output through the transfer gate TG1. At this time, the transfer gate TG2 is closed, and thus, an output node of the transfer gate TG2 becomes high impedance.

The selection circuit 4 identifies the data of the bit line pair BL<+> and BL<−> based on a potential of a signal, which is not high impedance, between output signals of the transfer gates TG1 and TG2.

In this manner, the bit line pair BL<+> and BL<−> is connected to the memory cell circuit 3, and the data of the bit line pair BL<+> and BL<−> is identified based on the potential of the bit line having the higher potential between the potentials of the one bit line BL<+> and the other bit line BL<−> constituting the bit line pair BL<+> and BL<−> in the first embodiment. As a result, the logic of the bit line can be identified based on the potential of the bit line having the smallest variation range of the bit line potential, and the reliability of the read data can be improved. The first data including the weighting coefficient is stored in the memory cell MC in the semiconductor integrated circuit 1 of the present embodiment, and the second data to be multiplied by the weighting factor is supplied through the word lines WL0 and WL1, so that it is possible to perform the multiplication in the arithmetic control circuit 2 and to perform the sum operation of the multiplications. Thus, the product-sum operation processing can be completed in the semiconductor integrated circuit 1.

Second Embodiment

The two word lines WL0 and WL1 are arranged with respect to the memory cell MC in the semiconductor integrated circuit 1 of FIG. 1. In the semiconductor integrated circuit 1 of FIG. 1, the word line WL0 between the two word lines WL0 and WL1 is not used for the multiplication with data in the memory cell MC, but is used for the purpose of discharging the other bit line BL<−> when the word line WL0 is selected.

The word line WL0 and the transistors Q11 and Q12 in FIG. 1 are unnecessarily required if there is a means for counting the number of selected word lines WL0. Therefore, one word line is arranged for a memory cell MC by omitting a word line WL0 in a semiconductor integrated circuit 1a according to a second embodiment.

Figure 11:
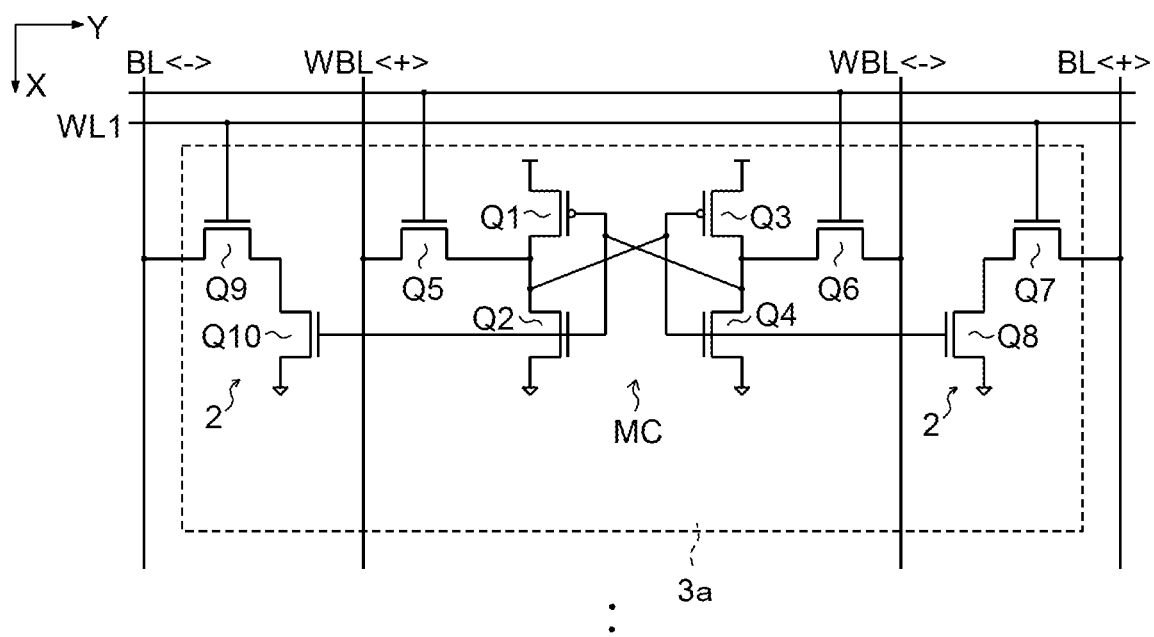
FIG. 11 is a circuit diagram of a semiconductor integrated circuit according to a second embodiment.

FIG. 11 is a circuit diagram of the semiconductor integrated circuit 1a according to the second embodiment. In FIG. 11, circuit elements common to those in FIG. 1 are denoted by the same reference signs, and differences will be mainly described hereinafter.

The semiconductor integrated circuit 1a of FIG. 11 has a circuit configuration in which the word line WL0 and the transistors Q11 and Q12 are omitted from FIG. 1, and has a memory cell circuit 3a that is simpler than the memory cell circuit 3. In FIG. 11, a circuit operation when a word line WL1 is selected is the same as that in FIG. 1.

When the word line WL1 is selected and Data 1 is stored in a memory cell MC, one bit line BL<+> is discharged via transistors Q7 and Q8. In addition, when the word line WL1 is selected and Data 0 is stored in the memory cell MC, the other bit line BL<−> is discharged via transistors Q9 and Q10.

Since the word line WL0 does not exist, it is difficult for the semiconductor integrated circuit 1a of FIG. 11 to perform a product-sum operation in a case where the word line WL0 is selected (second data is 0). However, the number of selected word lines WL0 can be grasped by subtracting the number of selected word lines WL1 from the total number of the memory cell circuits 3a connected to the bit line pair BL<+> and BL<−>.

Figure 12A:
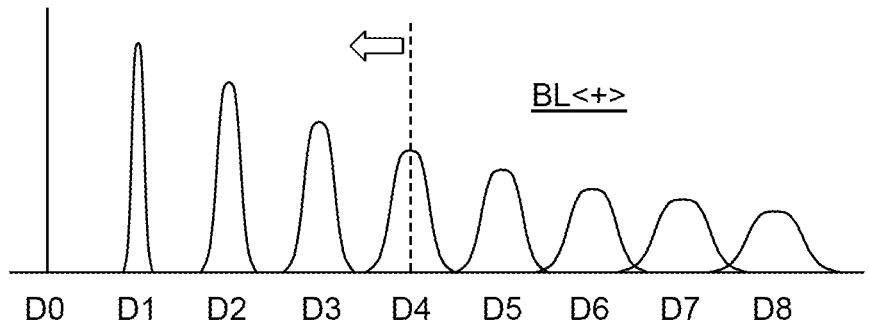
FIG. 12A is a diagram illustrating characteristics of a potential and a discharge current of one bit line when a word line is continuously selected eight times.

Hereinafter, a case where the total number of the memory cell circuits 3a connected to the bit line pair BL<+> and BL<−> is eight will be described. FIG. 12A is a diagram illustrating characteristics of a potential and a discharge current of the one bit line BL<+> when the word line WL1 is continuously selected eight times. In FIG. 12A, a horizontal axis represents the bit line potential, and a vertical axis represents the discharge current. When the word line WL1 is selected and a weighting factor stored in the memory cell MC is 1, the one bit line BL<+> is discharged. As the number of times of discharge increases, a drain-to-source voltage Vds of the transistors Q7 and Q8 decreases, and a variation of the bit line potential increases.

Figure 12B:
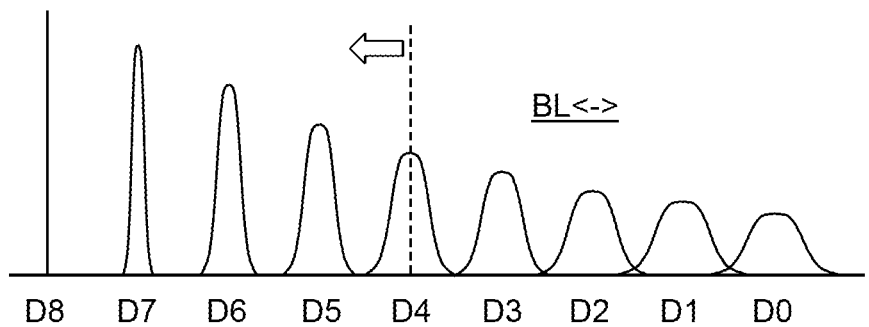
FIG. 12B is a diagram illustrating characteristics of a potential and a discharge current of the other bit line when the word line is continuously selected eight times.

When the word line WL1 is continuously selected eight times, the characteristics of the one bit line BL<+> illustrated in FIG. 12A are substantially the same as the characteristics of FIG. 4A, and characteristics of the other bit line BL<−> illustrated in FIG. 12B are also substantially the same as the characteristics of FIG. 4B. Thus, data of the bit line pair BL<+> and BL<−> can be accurately identified based on any one of the one bit line BL<+> and the other bit line BL<−> having a higher bit line potential.

However, when the number of selected word lines WL1 among the eight memory cells MC connected to the bit line pair BL<+> and BL<−> is smaller than eight, it is difficult to accurately identify the data of the bit line pair BL<+> and BL<−> only with the potential of the one bit line BL<+> or the other bit line BL<−>. The reason is that the number of selected word lines WL1 smaller than eight means that the number of selected word lines WL0 is one or more, but it is difficult to discharge the bit line pair BL<+> and BL<−> based on a multiplication result obtained when the word line WL0 is selected (when the second data is 0) since the word line WL0 does not exist in the semiconductor integrated circuit 1a of FIG. 11.

Figure 13A:
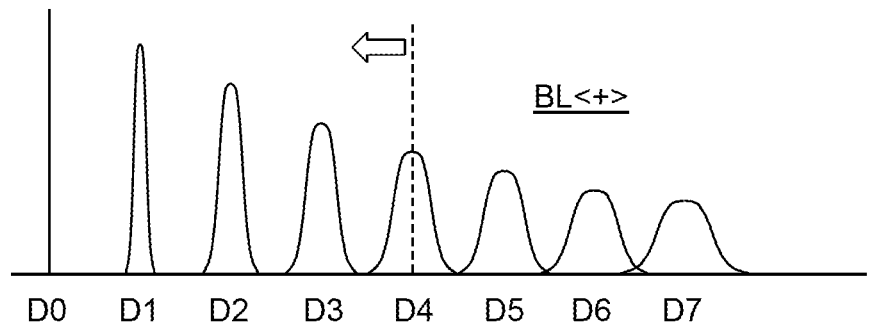
FIG. 13A is a diagram illustrating characteristics of a potential and a discharge current of one bit line when the word line is selected seven times.
Figure 13B:
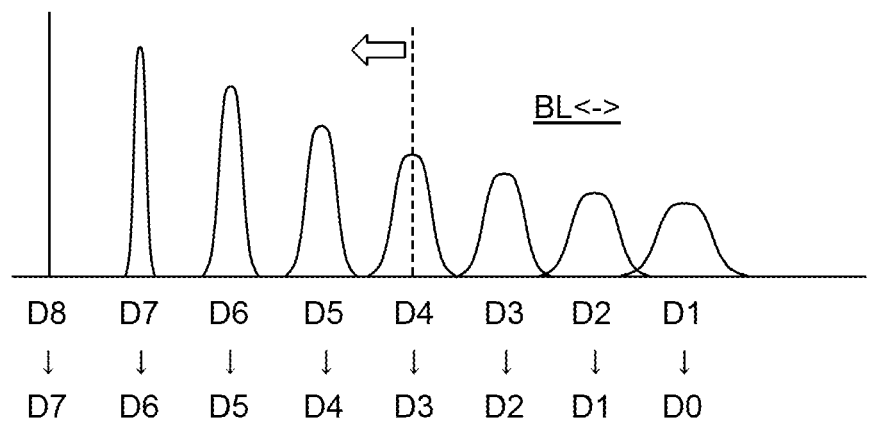
FIG. 13B is a diagram illustrating characteristics of a potential and a discharge current of the other bit line when the word line is selected seven times.

FIG. 13A is a diagram illustrating characteristics of a potential and a discharge current of the one bit line BL<+> when the word line WL1 is selected seven times. FIG. 13B is a diagram illustrating characteristics of a potential and a discharge current of the other bit line BL<−> when the word line WL1 is selected seven times. Since the characteristics of the one bit line BL<+> illustrated in FIG. 13A are correct, the number of times of discharge of the one bit line BL<+> can be accurately detected from the characteristics of FIG. 13A as long as the number of times of discharge is within four times.

On the other hand, the characteristics of the other bit line BL<−> illustrated in FIG. 13B are not correct. The reason is that the other bit line BL<−> is discharged by the number of selected word lines WL0 as illustrated in FIG. 1, but the discharge caused by the selection of the word line WL0 is not reflected in the characteristics of FIG. 13B. Since the word line WL0 does not exist in the circuit of FIG. 11, it is difficult to discharge the other bit line BL<−> by the number of selected word lines WL0.

Therefore, a correction circuit is provided to count the number of selected word lines WL1 in the present embodiment. If the number of selected word lines WL1 is known, the number of selected word lines WL0 can be grasped by subtracting the number of selected word lines WL1 from the total number of the memory cell circuits 3a connected to the bit line pair BL<+> and BL<−>. If the number of selected word lines WL0 can be grasped, the number of times of discharge obtained from the characteristics of FIG. 13B can be corrected.

For example, even if the number of times of discharge can be identified as twice based on FIG. 13B, the number of times of discharge of the other bit lines BL<−> is three times in a case where the word line WL0 is selected once. In this manner, the correction circuit detects the number of selected word lines WL1 or WL0 and corrects the number of times of discharge identified from FIG. 13B in the present embodiment.

Figure 14A:
FIG. 14A is a diagram illustrating a potential and a discharge current of one bit line when the word line is selected zero times.
Figure 14B:
FIG. 14B is a diagram illustrating a potential and a discharge current of the other bit line when the word line is selected zero times.

FIG. 14A is a diagram illustrating a potential and a discharge current of the one bit line BL<+> when the word line WL1 is selected 0 times. FIG. 14B is a diagram illustrating a potential and a discharge current of the other bit line BL<−> when the word line WL1 is selected 0 times. In this case, there is no variation in potential and no discharge current flows in both the one bit line BL<+> and the other bit line BL<−>. However, the word line WL0 is actually selected eight times, and thus, the other bit line BL<−> illustrated in FIG. 14B should be discharged eight times, and the characteristics of FIG. 14B should be corrected.

In this manner, when the number of selected word lines WL1 is smaller than the number of the memory cell circuits 3 connected to the bit line pair BL<+> and BL<−>, it is necessary to correct the data of the bit line BL<−> by the correction circuit.

Figure 15:
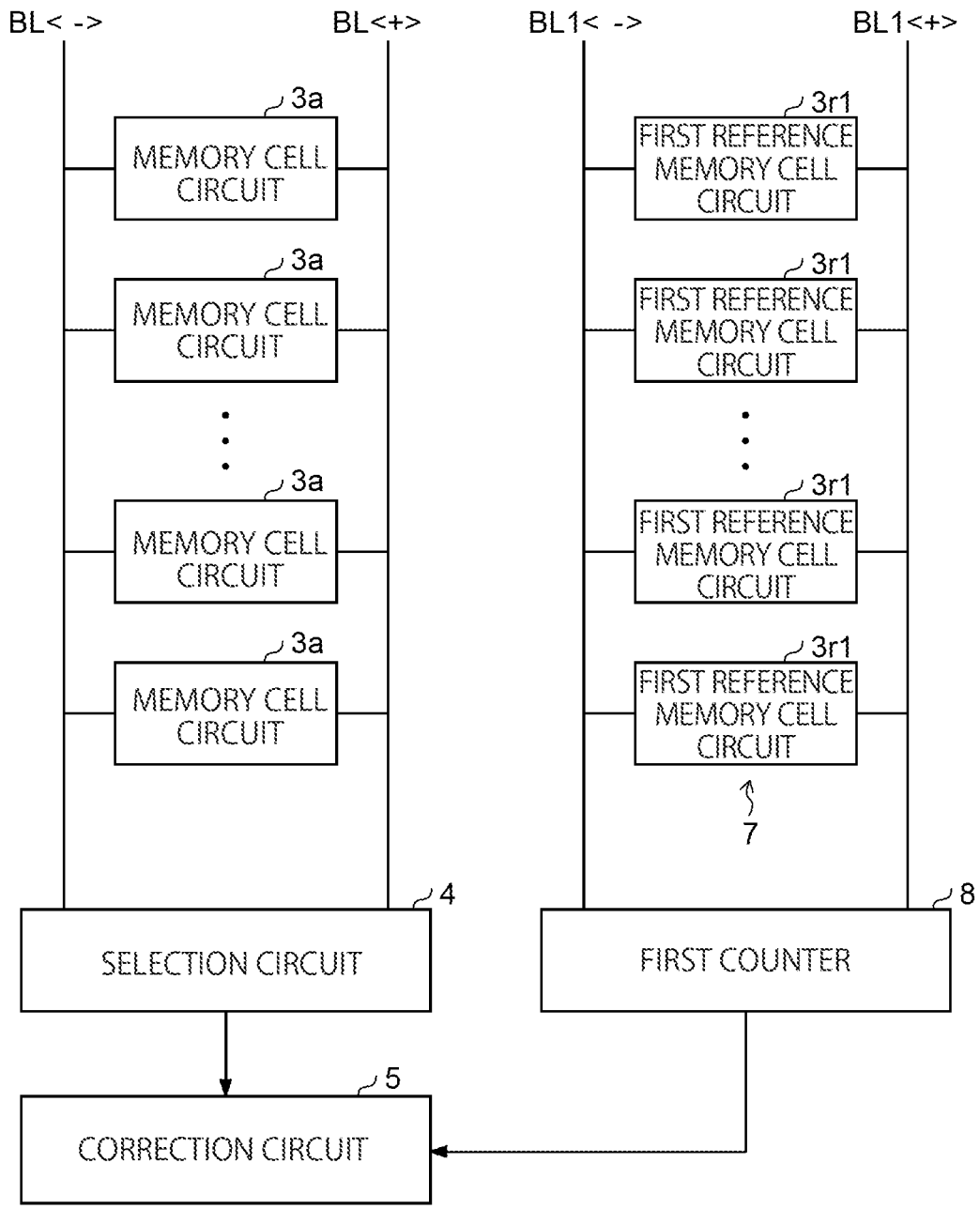
FIG. 15 is a diagram illustrating a first example of a semiconductor integrated circuit including a correction circuit.

FIG. 15 is a diagram illustrating a first example of a semiconductor integrated circuit 1b including a correction circuit 5. In addition to the configuration of FIG. 11, the semiconductor integrated circuit 1b of FIG. 15 includes a selection circuit 4, the correction circuit 5, a first reference cell group 7, a first reference bit line pair (third wiring pair) BL1<+> and BL1<−>, and a first counter 8.

The selection circuit 4 selects one of the one bit line BL<+> and the other bit line BL<−> having a higher potential. In addition, the selection circuit 4 identifies data of the bit line pair BL<+> and BL<−> based on a potential of the selected bit line.

The correction circuit 5 corrects the data of the bit line pair BL<+> and BL<−> identified by the selection circuit 4. The correction circuit 5 performs the correction for the number of times of discharge of the word line WL0 since the discharge by the word line WL0 is not reflected in the potential of the other bit line BL<−> in the semiconductor integrated circuit 1a of FIG. 11 as described above.

The first reference cell group 7 includes first reference memory cell circuits 3r1 as many as the number of the memory cell circuits 3 connected to the bit line pair BL<+> and BL<−> of FIG. 11. Each of the first reference memory cell circuits 3r1 includes a first reference memory cell MCr1 and an arithmetic control circuit 2 and is connected to the word line WL1, which is similar to the memory cell circuit 3 of FIG. 11. The word line WL1 is the same as the word line WL1 to which each of the memory cell circuits 3 in FIG. 11 is connected. Data 1 is stored in each of the first reference memory cells MCr1 in the plurality of first reference memory cell circuits 3r1. A plurality of the first reference cell groups 7 are connected to the first reference bit line pair BL1<+>, BL1<−>. The first reference bit line pair BL1<+>, BL1<−> is provided separately from the bit line pair BL<+> and BL<−> in FIG. 11.

When the word line WL1 is selected, a discharge current flows from the corresponding first reference memory cell circuit 3r1 to one first reference bit line, and the one first reference bit line is discharged.

In this manner, the first reference bit line is discharged the number of times corresponding to the number of selected word lines WL1.

The first counter 8 counts the number of selected word lines WL1 based on potentials of the first reference bit line pair BL1<+> and BL1<−>. More specifically, one first reference bit line BL1<+> is discharged each time the word line WL1 is selected, and thus, the first counter 8 counts the number of selected word lines WL1 based on the potential of the one first reference bit line BL1<+>. The first counter 8 can perform counting up to the number of the first reference memory cell circuits 3r1 at most. As the number of times of discharge of the first reference bit line BL1<+> increases, a variation range of the potential of the first reference bit line BL1<+> increases, and there is a possibility that it is difficult to accurately determine the number of times of discharge. Thus, it is desirable to prevent the potential variation range of the first reference bit line BL1<+> from becoming too large even if the number of selected word lines WL1 is large by setting a power supply voltage level of the first reference memory cell circuit 3r1 of FIG. 15 to be higher than a power supply voltage level of the memory cell circuit 3a.

The correction circuit 5 corrects the data of the bit line pair BL<+> and BL<−> identified by the selection circuit 4 based on a count value of the first counter 8. For example, when it is found from the count value of the first counter 8 that the number of selected word lines WL1 is seven, a value D7 obtained from the characteristics of FIG. 13B is corrected to D6.

FIG. 13B illustrates a correspondence relationship between data of the other bit line BL<−> before correction and corrected data. In a case where eight memory cells MC are connected to the bit line pair BL<+> and BL<−> and the word line WL1 is selected seven times, data D8 to D1 before correction are corrected to D7 to D0 by using the correction circuit 5.

Since the first reference cell group 7 in FIG. 15 is connected to the word line WL1, there is a possibility that it is difficult to correct the data of the bit line pair BL<+> and BL<−> correctly when the number of selected word lines WL1 is zero.

Figure 16:
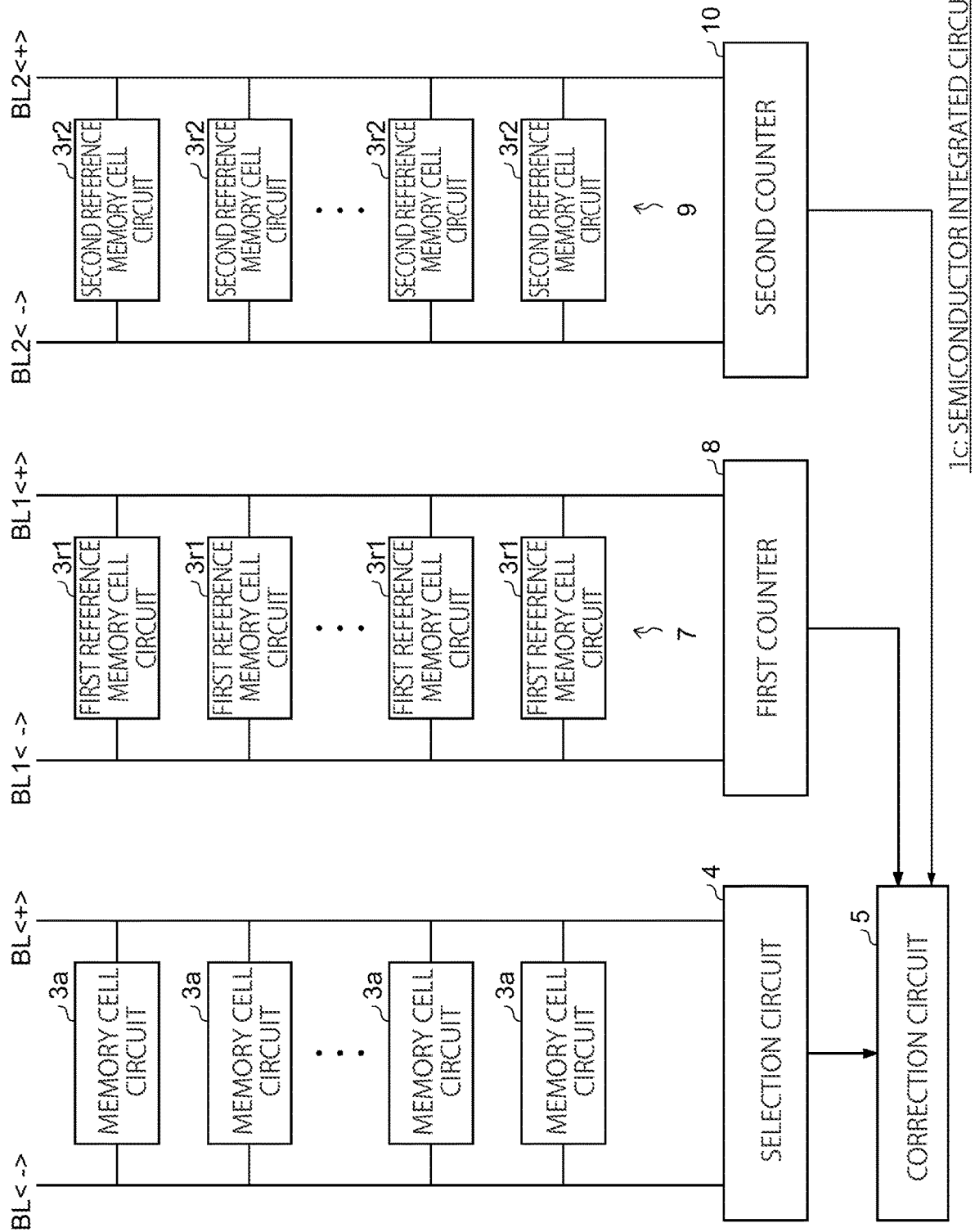
FIG. 16 is a diagram illustrating a second example of a semiconductor integrated circuit including a correction circuit.

FIG. 16 is a diagram illustrating a second example of a semiconductor integrated circuit is including a correction circuit 5. The semiconductor integrated circuit 1c of FIG. 16 includes a second reference cell group 9, a fourth wiring pair BL2<+> and BL2<->, and a second counter 10, in addition to the configuration of FIG. 15.

The second reference cell group 9 includes second reference memory cell circuits 3r2 as many as the number of the memory cell circuits 3 connected to the bit line pair BL<+> and BL<-> of FIG. 11. Each of the second reference memory cell circuits 3r2 includes a second reference memory cell MCr2 and the arithmetic control circuit 2 and is connected to the word line WL0, which is similar to the memory cell circuit 3 of FIG. 11. The word line WL0 is not provided in the semiconductor integrated circuit 1a of FIG. 11, and thus, needs to be newly provided.

Data 0 is stored in each of the second reference memory cells MCr2 in the plurality of second reference memory cell circuits 3r2. In this manner, the second reference memory cell MCr2 stores data of a logic opposite to that of the first reference memory cell MCr1. A plurality of the second reference cell groups 9 are connected to the second reference bit line pair BL2<+> and BL2<->. The second reference bit line pair BL2<+> and BL2<-> is provided separately from the bit line pair BL<+> and BL<-> in FIG. 11.

When the word line WL0 is selected, a discharge current flows from the corresponding second reference memory cell circuit 3r2 to one second reference bit line, and the one second reference bit line is discharged.

In this manner, the second reference bit line is discharged the number of times corresponding to the number of selected word lines WL0.

The second counter 10 counts the number of selected word lines WL0 based on potentials of the second reference bit line pair BL2<+> and BL2<->. More specifically, one second reference bit line BL2<-> is discharged each time the word line WL0 is selected, and thus, the second counter 10 counts the number of selected word lines WL0 based on the potential of the one second reference bit line BL2<->. The second counter 10 can perform counting up to the number of the second reference memory cell circuits 3r2.

The correction circuit 5 corrects the data of the bit line pair BL<+> and BL<-> identified by the selection circuit 4 based on at least one of the count value of the first counter 8 and a count value of the second counter 10. For example, when it is found from the count value of the second counter 10 that the number of selected word lines WL0 is eight, a value D8 obtained from the characteristics of FIG. 14B is corrected to D0. The first counter 8 and the second counter 10 count the number of times of discharge of the first reference bit line BL1<+> and the number of times of discharge of the second reference bit line BL2<->. As the number of times of discharge increases, the variation ranges of the potentials of the first reference bit line BL1<+> and the second reference bit line BL2<-> increase, and it is difficult to accurately determine the number of times of discharge. Thus, it is desirable that the correction circuit 5 grasp the number of selected word lines WL0 or WL1 based on the count value of any of the first reference bit line BL1<+> and the second reference bit line BL2<-> having the smaller number of times of discharge.

In this manner, a product-sum operation similar to that of the first embodiment can be performed by providing one word line for each of the memory cell circuits 3 in the second embodiment. Thus, the circuit configuration of the memory cell circuit 3 can be simplified as compared with the first embodiment. Since the word line WL0 is omitted in the second embodiment, it is necessary to correct the data of the bit line pair BL<+> and BL<-> when the product-sum operation of selecting the word line WL0 is performed. Therefore, the correction circuit 5 is provided to detect the number of selected word lines WL1 or WL0 and to correct the data of the bit line pair BL<+> and BL<-> based on the detected selection number, whereby the data of the bit line pair BL<+> and BL<-> can be identified with the same accuracy as in the first embodiment. Although it is necessary to provide the correction circuit 5, the first reference cell group 7, the second reference cell group 9, the first counter 8, the second counter 10, and the like, the number of each of these additional circuits provided for the memory cell MC array including the plurality of memory cell circuits 3, which perform the product-sum operation, may be one. Thus, an internal configuration of the memory cell circuit 3 can be simplified, a size of the memory cell MC array can be significantly reduced as compared with the first embodiment, and the semiconductor integrated circuit 1a as a whole can be reduced as compared with the first embodiment.

Third Embodiment

Figure 17:
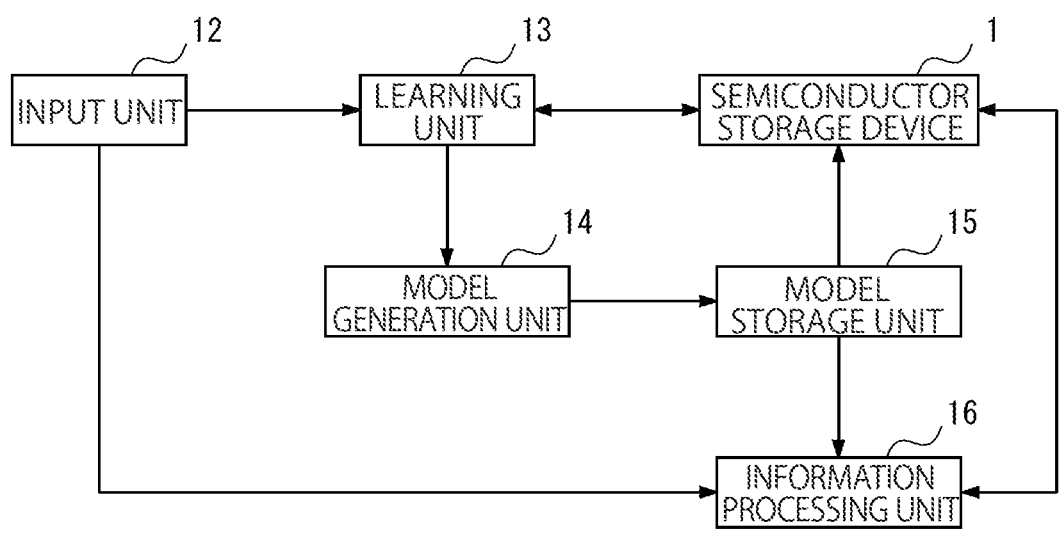
FIG. 17 is a block diagram illustrating an example of an information processing apparatus.

The semiconductor integrated circuit 1, 1a, 1b, or 1c according to the first or second embodiment can be applied to an information processing apparatus that generates a calculation model and performs arbitrary information processing. FIG. 17 is a block diagram illustrating an example of an information processing apparatus 11. The information processing apparatus 11 in FIG. 17 includes an input unit 12, a learning unit 13, the semiconductor integrated circuit 1 according to the present embodiment, a model generation unit 14, a model storage unit 15, and an information processing unit 16. The entire information processing apparatus of FIG. 17 can be formed on the same or a plurality of semiconductor substrates. Note that FIG. 17 illustrates an example including the semiconductor integrated circuit 1 of FIG. 1, but it is also possible to use the semiconductor integrated circuit 1a, 1b, or 1c.

The input unit 12 inputs various types of information necessary for generation of a calculation model. The learning unit 13 performs a process of updating a weighting factor of a neural network used in the calculation model. The information processing apparatus 11 in FIG. 17 performs a product-sum operation of input data of the neural network and the weighting factor in the semiconductor integrated circuit 1. The learning unit 13 acquires a result of the product-sum operation output to a bit line pair BL<+> and BL<-> of the semiconductor integrated circuit 1 and performs a learning process of updating the weighting factor. The semiconductor integrated circuit 1 may be provided inside the learning unit 13.

The model generation unit 14 generates the calculation model reflecting a learning result obtained by the learning unit 13. The calculation model has the neural network including the updated weighting factor. As the input data is given to the calculation model, output data reflecting the learning result is obtained. The model storage unit 15 stores the calculation model generated by the model generation unit 14.

The information processing unit 16 inputs data input from the input unit 12 to the learned calculation model stored in the model storage unit 15, performs product-sum operation processing by the neural network, and acquires a result obtained by performing predetermined information processing. At this time, the information processing unit 16 can quickly perform the product-sum operation processing by performing the product-sum operation processing in the semiconductor integrated circuit 1.

FIG. 17 is an example of the information processing apparatus 11. The semiconductor integrated circuit 1 according to the present embodiment is unnecessarily specialized in the product-sum operation of the weighting factor of the neural network and the input data, and can be applied to various product-sum operations.

In this manner, the product-sum operation using the neural network can be performed entirely by hardware in the third embodiment, and thus, the product-sum operation and the information processing can be performed extremely quickly.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A semiconductor integrated circuit comprising:
a plurality of memory cells arranged in a first direction and each storing first data;
a plurality of first wirings provided to correspond to the plurality of memory cells arranged in the first direction and supplying second data to be multiplied by the first data;
a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is a first logic; and another second wiring which is discharged when the multiplication data is a second logic; and
a selection circuit that selects one of the one second wiring and the another second wiring having a higher potential.

2. The semiconductor integrated circuit according to claim 1, wherein
each of the one second wiring and the another second wiring is set to a potential corresponding to a number of times of discharge.

3. The semiconductor integrated circuit according to claim 2, wherein
a discharge current flows through the one second wiring and the another second wiring each time discharge is performed, and the discharge current decreases as the number of times of discharge increases.

4. The semiconductor integrated circuit according to claim 1, further comprising
an arithmetic control circuit that is connected between the second wiring pair and an output node of the memory cell corresponding to the second wiring pair, multiplies the first data output from the corresponding memory cell and the second data supplied from the first wiring corresponding to the memory cell, and discharges the one second wiring or the another second wiring based on a result of the multiplication.

5. The semiconductor integrated circuit according to claim 1, wherein
the selection circuit identifies data of the second wiring pair based on the potential of the selected second wiring.

6. The semiconductor integrated circuit according to claim 1, wherein
a number of the first wirings, provided to correspond to each of the plurality of memory cells arranged in the first direction, is two, and
the second wiring pair is discharged based on multiplication data of the second data supplied by the two first wirings and the first data stored in each of the plurality of memory cells.

7. A semiconductor integrated circuit comprising:
a plurality of memory cells arranged in a first direction and each storing first data;
a plurality of first wirings provided to correspond to the plurality of memory cells arranged in the first direction and supplying second data to be multiplied by the first data; and
a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is a first logic; and another second wiring which is discharged when the multiplication data is a second logic, wherein
a number of the first wirings, provided to correspond to each of the plurality of memory cells arranged in the first direction, is two,
the second wiring pair is discharged based on multiplication data of the second data supplied by the two first wirings and the first data stored in each of the plurality of memory cells,
one of the two first wirings is used to generate the multiplication data with the first data stored in the memory cell corresponding to the first wiring, and
a remaining first wiring of the two first wirings is used to discharge the one second wiring or the another second wiring independently of the first data stored in the memory cell corresponding to the remaining first wiring.

8. A semiconductor integrated circuit comprising:
a plurality of memory cells arranged in a first direction and each storing first data;
a plurality of first wirings provided to correspond to the plurality of memory cells arranged in the first direction and supplying second data to be multiplied by the first data; and
a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is a first logic; and another second wiring which is discharged when the multiplication data is a second logic, wherein
a number of the first wirings, provided to correspond to each of the plurality of memory cells arranged in the first direction, is two,
the second wiring pair is discharged based on multiplication data of the second data supplied by the two first wirings and the first data stored in each of the plurality of memory cells, and
the one second wiring and the another second wiring are exclusively discharged each time the first data and the second data are multiplied.

9. A semiconductor integrated circuit comprising:
a plurality of memory cells arranged in a first direction and each storing first data;
a plurality of first wirings provided to correspond to the plurality of memory cells arranged in the first direction and supplying second data to be multiplied by the first data; and
a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is a first logic; and another second wiring which is discharged when the multiplication data is a second logic, wherein
a number of the first wirings, provided to correspond to each of the plurality of memory cells arranged in the first direction, is two,
the second wiring pair is discharged based on multiplication data of the second data supplied by the two first wirings and the first data stored in each of the plurality of memory cells, and
the second wiring pair is discharged based on the multiplication data generated in one of the two first wirings, and is discharged based on a logic of a remaining first wiring of the two first wirings.

10. The semiconductor integrated circuit according to claim 5, further comprising
a correction circuit that corrects the data of the second wiring pair identified by the selection circuit.

11. The semiconductor integrated circuit according to claim 10, wherein
a number of the first wirings, provided for each of the plurality of memory cells arranged in the first direction, is one, and
any one of the one second wiring and the another second wiring is discharged or both of the one second wiring and the another second wiring are not discharged according to a logic of the multiplication data.

12. The semiconductor integrated circuit according to claim 11, wherein
the second data is determined by a logic of the first wiring and a logic of a virtual first wiring selected when the first wiring is not selected, and
the correction circuit corrects the data of the second wiring pair identified by the selection circuit based on at least one of a number of times of selection of the first wiring and a number of times of selection of the virtual first wiring.

13. The semiconductor integrated circuit according to claim 12, further comprising:
a first counter counting the number of times of selection of the first wiring; and
a second counter that counts the number of times of selection of the virtual first wiring, wherein
the correction circuit corrects the data of the second wiring pair identified by the selection circuit based on at least one of a count value of the first counter and a count value of the second counter.

14. The semiconductor integrated circuit according to claim 11, further comprising
a first counter that counts a number of times of selection of the first wiring, wherein
the second data is determined by a logic in which the first wiring is selected and a logic in which the first wiring is not selected, and the correction circuit corrects the data of the second wiring pair identified by the selection circuit based on a count value of the first counter.

15. The semiconductor integrated circuit according to claim 14, further comprising:
a first reference cell group that is provided to correspond to the first wiring, has first reference memory cells as many as the plurality of memory cells, and stores data of an identical logic in the first reference memory cells; and
a third wiring pair including one third wiring which is discharged when the first wiring is selected and another third wiring which is not discharged when the first wiring is selected, wherein
the first counter counts the number of times of selection of the first wiring based on a potential of the one third wiring.

16. The semiconductor integrated circuit according to claim 15, wherein
a power supply voltage level of the first reference cell group is higher than power supply voltage levels of the plurality of memory cells.

17. The semiconductor integrated circuit according to claim 15, further comprising:
a plurality of fourth wirings each of which is provided to correspond to the first wiring and is selected when the corresponding first wiring is not selected;
a second reference cell group which is provided to correspond to the fourth wirings, has second reference memory cells as many as the plurality of memory cells, and stores data of an identical logic in the second reference memory cells;
a fifth wiring pair including one fifth wiring which is discharged when the fourth wiring is selected and another fifth wiring which is not discharged when the fourth wiring is selected; and
a second counter that counts a number of selections of the fourth wiring based on a potential of the one fifth wiring, wherein
the correction circuit corrects the data of the second wiring pair identified by the selection circuit based on at least one of the count value of the first counter and a count value of the second counter.

18. The semiconductor integrated circuit according to claim 1, wherein
the first data is a weighting factor of a neural network,
the second data is input data of the neural network, and
the second wiring pair transmits product-sum data obtained by adding pieces of the multiplication data of the first data and the second data.

19. An information processing apparatus comprising:
a learning unit that performs a learning process of updating a weighting factor of a neural network using input data and output data for learning;
a semiconductor storage device that executes a product-sum operation of adding pieces of multiplication data obtained by multiplying the input data by the weighting factor according to a network configuration of the neural network;
a calculation model generation unit that generates a calculation model including the neural network on which the learning process by the learning unit has been performed; and
an information processing unit that gives the input data to the calculation model to perform predetermined information processing based on a result obtained by executing the product-sum operation according to the network configuration of the neural network in the calculation model, wherein
the semiconductor storage device includes:
- a plurality of memory cells arranged in a first direction and each storing first data;
- a plurality of first wirings provided to correspond to the plurality of memory cells arranged in the first direction and supplying second data to be multiplied by the first data; and
- a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is a first logic; and another second wiring which is discharged when the multiplication data is a second logic; and
- a selection circuit that selects one of the one second wiring and the another second wiring having a higher potential.

* * * * *